(12) United States Patent
Park et al.

(10) Patent No.: US 11,380,651 B2
(45) Date of Patent: Jul. 5, 2022

(54) SEMICONDUCTOR PACKAGE INCLUDING STACKED SEMICONDUCTOR CHIPS

(71) Applicant: SK hynix Inc., Icheon-si (KR)

(72) Inventors: Hong-Bum Park, Seoul (KR); Jeong-Hyun Park, Icheon-si (KR); Suk-Won Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/867,328

(22) Filed: May 5, 2020

(65) Prior Publication Data

US 2021/0111152 A1 Apr. 15, 2021

(30) Foreign Application Priority Data

Oct. 15, 2019 (KR) .......................... 10-2019-0127756

(51) Int. Cl.
*H01L 25/065* (2006.01)

(52) U.S. Cl.
CPC .. *H01L 25/0652* (2013.01); *H01L 2225/0651* (2013.01); *H01L 2225/06506* (2013.01);
(Continued)

(58) Field of Classification Search
CPC ............. H01L 25/0652; H01L 25/0657; H01L 25/071; H01L 25/072; H01L 2224/32145;
(Continued)

(56) References Cited

U.S. PATENT DOCUMENTS 10,002,853 B2 * 6/2018 Oh ...................... H01L 25/0657
10,804,209 B2 * 10/2020 Kang ..................... H01L 23/16
(Continued)

FOREIGN PATENT DOCUMENTS

| KR | 1020140095182 A | 8/2014 |
| KR | 101668444 B1 | 10/2016 |
| KR | 1020200043716 A | 4/2020 |

OTHER PUBLICATIONS

Agarwal, What Are The Advantages Of Using A Printed Circuit Board (PCB), 2017, https://www.edgefx.in/advantages-using-printed-circuit-board-pcb/as viewed Jul. 21, 2021 (Year: 2017).*

*Primary Examiner* — Bradley Smith
*Assistant Examiner* — William Henry Anderson
(74) *Attorney, Agent, or Firm* — William Park & Associates Ltd.

(57) ABSTRACT

A semiconductor package includes a base substrate; a printed circuit board disposed on the base substrate; a first chip stack disposed on the base substrate on one side of the printed circuit board, and including first semiconductor chips offset-stacked in a first offset direction facing the printed circuit board; a second chip stack disposed on the first chip stack, and including second semiconductor chips offset-stacked in a second offset direction facing away from the printed circuit board; a third chip stack disposed on the base substrate on the other side of the printed circuit board, and including third semiconductor chips offset-stacked in the second offset direction; and a fourth chip stack disposed on the third chip stack, and including fourth semiconductor chips offset-stacked in the first offset direction, wherein the second and fourth chip stacks are electrically connected with the base substrate through the printed circuit board.

21 Claims, 10 Drawing Sheets

(52) U.S. Cl.
CPC ............... *H01L 2225/06562* (2013.01); *H01L 2225/06586* (2013.01)

(58) Field of Classification Search
CPC . H01L 2224/48141; H01L 2224/48145; H01L 2225/06562; H01L 23/49833; H01L 2224/32225; H01L 2225/06548; H01L 23/49827; H01L 23/481; H01L 2225/06506; H01L 2225/0651; H01L 2224/48235; H01L 2224/04042; H01L 2224/48227; H01L 2224/73265; H01L 24/46; H01L 23/538; H01L 23/5386
See application file for complete search history.

(56) References Cited

U.S. PATENT DOCUMENTS

| | | | |
|---|---|---|---|
| 10,861,826 B2* | 12/2020 | Oh | H01L 24/17 |
| 2013/0277831 A1* | 10/2013 | Yoon | H01L 24/13 |
| | | | 257/737 |
| 2014/0203457 A1* | 7/2014 | Kim | H01L 25/0652 |
| | | | 257/778 |
| 2017/0141092 A1* | 5/2017 | Kim | H01L 24/73 |
| 2019/0139934 A1* | 5/2019 | Ng | H01L 25/0657 |

\* cited by examiner

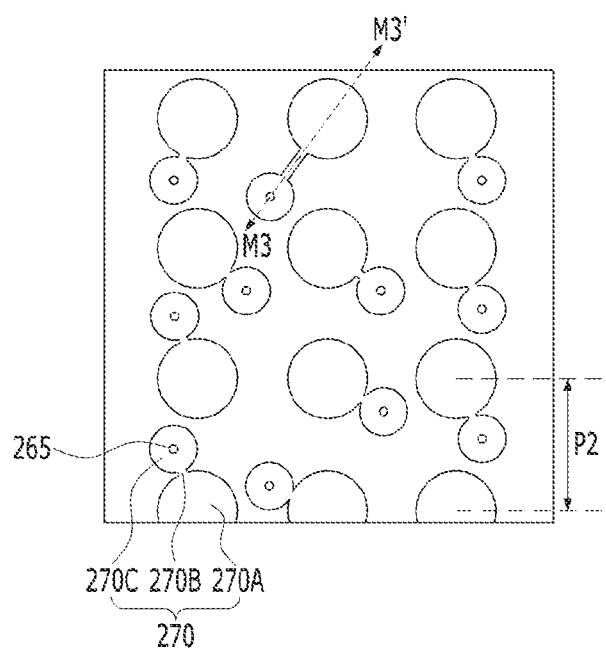

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2019-0127756 filed on Oct. 15, 2019, which is incorporated herein by reference in its entirety.

BACKGROUND

1. Technical Field

This patent document relates to a semiconductor package, and more particularly, to a semiconductor package in which a plurality of chips are stacked on a substrate.

2. Related Art

An electronic product is required to be capable of processing high-capacity data even while being decreased in its volume. Accordingly, there is a growing need to increase the degree of integration of a semiconductor device used in such an electronic product.

However, due to a limitation in semiconductor integration technology, it is difficult to satisfy required capacity with only a single semiconductor chip, and thus, a semiconductor package is manufactured in a type in which a plurality of semiconductor chips are embedded in one semiconductor package.

Even though the semiconductor package includes the plurality of semiconductor chips, the semiconductor package is required to be fabricated to have a designated size or less depending on a requirement of an application in which the semiconductor package is mounted.

SUMMARY

In an embodiment, a semiconductor package may include: a base substrate; a printed circuit board disposed on first surface of the base substrate; a first chip stack disposed on the first surface of the base substrate on one side of the printed circuit board, and including a plurality of first semiconductor chips which are offset-stacked in a first offset direction facing the printed circuit board; a second chip stack disposed on the first chip stack, and including a plurality of second semiconductor chips which are offset-stacked in a second offset direction facing away from the printed circuit board; a third chip stack disposed on the first surface of the base substrate on the other side of the printed circuit board, and including a plurality of third semiconductor chips which are offset-stacked in the second offset direction; and a fourth chip stack disposed on the third chip stack, and including a plurality of fourth semiconductor chips which are offset-stacked in the first offset direction, wherein the second and fourth chip stacks are electrically connected with the base substrate through the printed circuit board.

BRIEF DESCRIPTION OF THE DRAWINGS

FIGS. 4A, 4B and 4C are planar views of first to third wiring layers, respectively, illustrated in FIG. 3.

DETAILED DESCRIPTION

Figure 1:
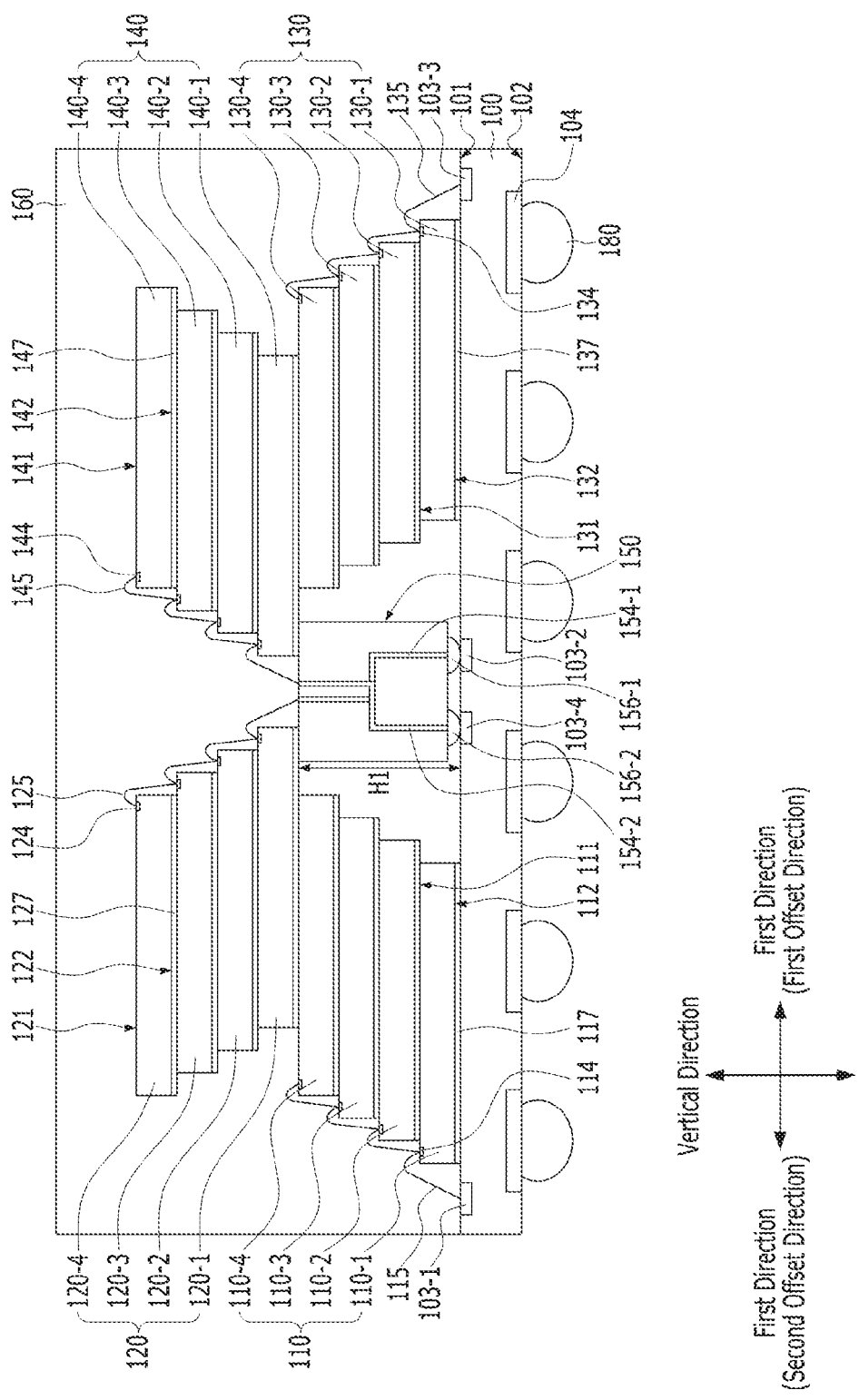
FIG. 1 is a cross-sectional view illustrating a semiconductor package in accordance with an embodiment of the present disclosure.

Hereinafter, various examples of embodiments of the disclosure will be described with reference to the accompanying drawings.

The drawings might not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Various embodiments may be directed to a semiconductor package which is capable of satisfying high performance and high capacity while having a reduced area.

Figure 2:
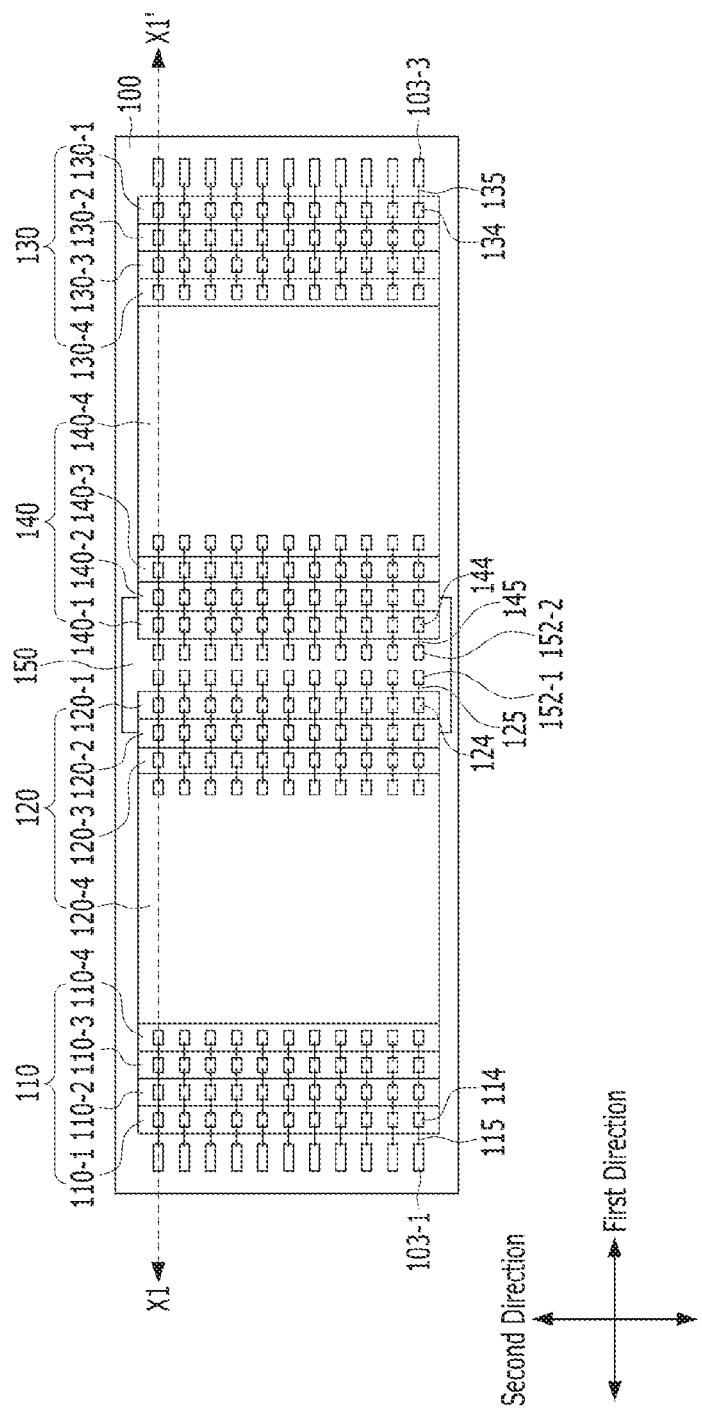
FIG. 2 is a planar view, seen from the top, of the semiconductor package illustrated in FIG. 1.

FIG. 1 is a cross-sectional view illustrating a semiconductor package in accordance with an embodiment of the present disclosure, and FIG. 2 is a planar view, seen from the top, of the semiconductor package illustrated in FIG. 1. FIG. 1 illustrates the cross-section taken along the line X1-X1' of FIG. 2.

Referring to FIGS. 1 and 2, the semiconductor package in accordance with an embodiment of the present disclosure may include a base substrate 100, first to fourth chip stacks 110, 120, 130 and 140 and a printed circuit board 150 which are disposed on the base substrate 100, and a molding layer 160 which covers the first to fourth chip stacks 110, 120, 130 and 140 and the printed circuit board 150 on the base substrate 100.

The base substrate 100 may have a first surface 101, for example, a top surface, on which the first to fourth chip stacks 110, 120, 130 and 140 and the printed circuit board 150 may be disposed, and a second surface 102, for example, a bottom surface, which faces away from the first surface 101 and on which external connection terminals 180 for connecting the semiconductor package with the outside may be disposed.

The base substrate 100 may include a circuit and/or wiring structure for transfer of electrical signals between the first to fourth chip stacks 110, 120, 130 and 140 and the printed circuit board 150, and the external connection terminals 180. For example, the base substrate 100 may include a printed circuit board (PCB), a redistribution layer, or the like.

The base substrate 100 may include conductive pads 103-1, 103-2, 103-3 and 103-4 disposed on the first surface 101, and conductive pads 104 disposed on the second surface 102. The conductive pads 103-1, 103-2, 103-3 and 103-4 may be for electrically connecting the first to fourth chip stacks 110, 120, 130 and 140 and the printed circuit board 150 with the base substrate 100. Also, the conductive pads 104 may be to electrically connect the external connection terminals 180 with the base substrate 100. For reference, conductive pads may mean electrically conductive elements or terminals which are exposed on the surfaces of the base substrate 100 to connect the base substrate 100 with other components. Such conductive pads 103-1, 103-2, 103-3, 103-4 and 104 may be connected with the circuit and/or wiring structure inside the base substrate 100.

The conductive pads 103-1, 103-2, 103-3 and 103-4 on the first surface 101 may include first to fourth conductive pads 103-1, 103-2, 103-3 and 103-4 for connection with the first chip stack 110, the second chip stack 120, the third chip stack 130 and the fourth chip stack 140, respectively. The first and third conductive pads 103-1 and 103-3 may be bond fingers to be connected with the first chip stack 110 and the third chip stack 130, respectively, by wire bonding. The second and fourth conductive pads 103-2 and 103-4 may be ball lands for connection with connection terminals 156-1 and 156-2, for example, solder balls, of the printed circuit board 150 to which the second and fourth chip stacks 120 and 140 are electrically connected. The conductive pads 104 on the second surface 102 may be ball lands for connection with the external connection terminals 180, for example, solder balls.

The first chip stack 110 may be disposed on one side, for example, a left side, of the printed circuit board 150, on the base substrate 100 to be spaced apart from the printed circuit board 150. The first chip stack 110 may include a plurality of first semiconductor chips 110-1 to 110-4 which are stacked in a vertical direction with respect to the first surface 101 of the base substrate 100. The present embodiment illustrates a case where the first chip stack 110 includes four first semiconductor chips 110-1 to 110-4. However, it is to be noted that the disclosure is not limited thereto, and the number of semiconductor chips included in the first chip stack 110 may be variously changed to two, eight, etc. Hereinafter, for the sake of convenience in explanation, the first semiconductor chips 110-1 to 110-4 are sequentially denoted by the reference numerals 110-1 to 110-4, respectively, from closest one to farthest one with respect to the base substrate 100.

The first semiconductor chips 110-1 to 110-4 may be the same chips, in particular, the same memory chips. For example, each of the first semiconductor chips 110-1 to 110-4 may be a NAND flash memory. However, it is to be noted that the disclosure is not limited thereto, and each of the first semiconductor chips 110-1 to 110-4 may be a nonvolatile memory chip such as a phase-change random access memory (PRAM) and a magnetoresistive random access memory (MRAM) or a volatile memory chip such as a dynamic random access memory (DRAM) and a static random access memory (SRAM).

Each of the first semiconductor chips 110-1 to 110-4 may include an active surface 111 on which first chip pads 114 are disposed, an inactive surface 112 which faces away from the active surface 111, and a side surface which connects the active surface 111 and the inactive surface 112 with each other. When a direction parallel to the active surface 111 or the inactive surface 112 and parallel to the line X1-X1' is defined as a first direction, the first chip pads 114 may be disposed in one edge region, for example, a left edge region, of both edge regions of the active surface 111 in the first direction. That is to say, the first chip pads 114 may be disposed in an edge pad type. When a direction parallel to the active surface 111 or the inactive surface 112 and intersecting with the first direction is defined as a second direction, the plurality of first chip pads 114 may be arranged in a line in the second direction. However, it is to be noted that the disclosure is not limited thereto, and the first chip pads 114 may be arranged in various forms in the one edge region in the first direction.

The first semiconductor chips 110-1 to 110-4 may be stacked on the base substrate 100 in a form in which the inactive surface 112 faces the base substrate 100 and the active surface 111 faces away from the inactive surface 112, that is, in a face-up form. An adhesive layer 117 may be formed on the inactive surface 112 of each of the first semiconductor chips 110-1 to 110-4. By the adhesive layer 117, each of the first semiconductor chips 110-1 to 110-4 may be attached to each of the first semiconductor chips 110-1 to 110-3 and the first surface 101 of the base substrate 100 lying thereunder. The adhesive layer 117 may include an insulating adhesive material such as a die attach film (DAF).

The first semiconductor chips 110-1 to 110-4 may be stacked in a form in which all of the first chip pads 114 are exposed. For example, the first semiconductor chips 110-1 to 110-4 may be stacked with a predetermined offset from one side where the first chip pads 114 are disposed, for example, a left side, toward the other side which faces away from the one side, for example, a right side, in the first direction. The offset direction of the first semiconductor chips 110-1 to 110-4 will be hereinafter referred to as a first offset direction.

According to such offset stacking, one of the first semiconductor chips 110-1 to 110-4 may be in a state in which one end, for example, a left end, positioned opposite to the first offset direction projects out from over another one of the first semiconductor chips 110-1 to 110-4 lying immediately thereon. Because the first chip pads 114 are disposed and exposed on the projecting end, first interconnectors 115, for example, bonding wires, to be connected with the first chip pads 114 may be formed. Meanwhile, as will be described later, one end, for example, the left end, of the first semiconductor chip 110-4 which is positioned uppermost in the first chip stack 110 may project out from under a second semiconductor chip 120-1 which is positioned lowermost in the second chip stack 120 and lies immediately on the first semiconductor chip 110-4.

The first interconnectors 115 may be formed at one side, for example, a left side, of the first chip stack 110. The first interconnectors 115 may electrically connect the first semiconductor chips 110-1 to 110-4 with one another and electrically connect the first chip stack 110 with the base substrate 100. In the present embodiment, the first interconnectors 115 may be bonding wires which connect the first chip pads 114 adjacent in the vertical direction with one another and connect the first chip pads 114 of the lowermost first semiconductor chip 110-1 to the first conductive pads 103-1. In other words, the first chip stack 110 may be electrically connected to the base substrate 100 by wire bonding. However, it is to be noted that the present embodiment is not limited thereto, and various types of electrical interconnectors such as leads, conductive tapes and conductive pastes may be used as the first interconnectors 115.

The thickness of the first chip stack 110, that is, the distance from the first surface 101 of the base substrate 100 to the active surface 111 of the uppermost first semiconductor chip 110-4 will be referred to as a first thickness H1. The first thickness H1 may be substantially the same as the thickness of the printed circuit board 150 which will be described later.

The second chip stack 120 may be disposed on the first chip stack 110. The second chip stack 120 may include a plurality of second semiconductor chips 120-1 to 120-4 which are stacked in the vertical direction. While the present embodiment illustrates a case where the second chip stack 120 includes four second semiconductor chips 120-1 to 120-4, it is to be noted that the number of second semiconductor chips included in the second chip stack 120 may be changed variously. Also, while, in the present embodiment, the number of second semiconductor chips included in the second chip stack 120 and the number of first semiconductor chips included in the first chip stack 110 are the same as each other, it is to be noted that these numbers may be different from each other. For the sake of convenience in explanation, the second semiconductor chips 120-1 to 120-4 are sequentially denoted by the reference numerals 120-1 to 120-4, respectively, from closest one to farthest one with respect to the base substrate 100.

The second semiconductor chips 120-1 to 120-4 may be the same chips, in particular, the same memory chips. For example, each of the second semiconductor chips 120-1 to 120-4 may be a NAND flash memory. However, it is to be noted that the disclosure is not limited thereto, and each of the second semiconductor chips 120-1 to 120-4 may be a nonvolatile memory chip such as a phase-change random access memory (PRAM) and a magnetoresistive random access memory (MRAM) or a volatile memory chip such as a dynamic random access memory (DRAM) and a static random access memory (SRAM). Further, the second semiconductor chips 120-1 to 120-4 may be the same chips as the first semiconductor chips 110-1 to 110-4.

Each of the second semiconductor chips 120-1 to 120-4 may include an active surface 121 on which second chip pads 124 are disposed, an inactive surface 122 which faces away from the active surface 121, and a side surface which connects the active surface 121 and the inactive surface 122 with each other. As opposed to the position of the first chip pads 114, the second chip pads 124 may be disposed in the other edge region, for example, a right edge region, of both edge regions of the active surface 121 in the first direction. That is to say, the second chip pads 124 may be disposed in an edge pad type. The plurality of second chip pads 124 may be arranged in a line in the second direction. However, it is to be noted that the disclosure is not limited thereto, and the second chip pads 124 may be arranged in various forms in the other edge region in the first direction.

In the case where the second semiconductor chips 120-1 to 120-4 are the same chips as the first semiconductor chips 110-1 to 110-4, the second semiconductor chips 120-1 to 120-4 may be in the same state as a state in which the first semiconductor chips 110-1 to 110-4 are rotated by 180 degrees about one axis parallel to the vertical direction. In this case, the second semiconductor chips 120-1 to 120-4 may have the same shape, structure and so forth as the first semiconductor chips 110-1 to 110-4 except that the position of chip pads is opposite.

The plurality of second semiconductor chips 120-1 to 120-4 may be stacked on the first chip stack 110 in a form in which the inactive surface 122 faces the base substrate 100 and the active surface 121 faces away from the inactive surface 122, that is, in a face-up form. An adhesive layer 127 may be formed on the inactive surface 122 of each of the second semiconductor chips 120-1 to 120-4. By the adhesive layer 127, each of the second semiconductor chips 120-1 to 120-4 may be attached to each of the second semiconductor chips 120-1 to 120-3 and the active surface 111 of the first semiconductor chip 110-4 positioned uppermost in the first chip stack 110 and/or the top surface of the printed circuit board 150 lying thereunder.

The second semiconductor chips 120-1 to 120-4 may be stacked in a form in which all of the second chip pads 124 are exposed. For example, the second semiconductor chips 120-1 to 120-4 may be stacked with a predetermined offset from the other side where the second chip pads 124 are disposed, for example, a right side, toward one side which faces away from the other side, for example, a left side, in the first direction. The offset direction of the second semiconductor chips 120-1 to 120-4 will be hereinafter referred to as a second offset direction. The second offset direction may be opposite to the first offset direction.

According to such offset stacking, one of the second semiconductor chips 120-1 to 120-4 may be in a state in which the other end, for example, a right end, positioned opposite to the second offset direction projects out from under another one of the second semiconductor chips 120-1 to 120-4 lying immediately thereon. Because the second chip pads 124 are disposed and exposed on the projecting end, second interconnectors 125, for example, bonding wires, to be connected with the second chip pads 124 may be formed. Moreover, the second semiconductor chip 120-1 positioned lowermost in the second chip stack 120 may have an end which projects rightward out from over the first semiconductor chip 110-4 positioned uppermost in the first chip stack 110 such that the first chip pads 114 of the first semiconductor chip 110-4 positioned uppermost in the first chip stack 110 are exposed. A portion of the right end of the second semiconductor chip 120-1 which projects, as described above, out from over the first semiconductor chip 110-4 positioned uppermost in the first chip stack 110 may overlap with the printed circuit board 150.

The second interconnectors 125 may be formed at the other side, for example, a right side, of the second chip stack 120. The second interconnectors 125 may electrically connect the second semiconductor chips 120-1 to 120-4 with one another and electrically connect the second chip stack 120 with the printed circuit board 150. In the present embodiment, the second interconnectors 125 may be bonding wires which connect the second chip pads 124 adjacent in the vertical direction with one another and connect the second chip pads 124 of the lowermost second semiconductor chip 120-1 to first bond fingers 152-1 of the printed circuit board 150. In other words, the second chip stack 120 may be electrically connected to the printed circuit board 150 by wire bonding. The second chip stack 120 may be electrically connected with the base substrate 100, in particular, the second conductive pads 103-2, through the printed circuit board 150. The printed circuit board 150 and the connection of the second chip stack 120 and the base substrate 100 therethrough will be described later.

The thickness of the second chip stack 120 may be the same as the thickness H1 of the first chip stack 110. However, these thicknesses may be different from each other.

As a consequence, the stack structure of the first chip stack 110 and the second chip stack 120 may have an arrow shape which directs in the first offset direction or directs toward the printed circuit board 150 in the first direction.

The third chip stack 130 may be positioned opposite to the first chip stack 110 with the printed circuit board 150 interposed therebetween on the base substrate 100. For example, in the case where the first chip stack 110 is positioned on the left side of the printed circuit board 150, the third chip stack 130 may be disposed on the right side of the printed circuit board 150 to be spaced apart from the printed circuit board 150. The present embodiment illustrates a case where the third chip stack 130 includes four third semiconductor chips 130-1 to 130-4. However, it is to be noted that the disclosure is not limited thereto, and the number of semiconductor chips included in the third chip stack 130 may be variously changed. Also, while, in the present embodiment, the number of third semiconductor chips included in the third chip stack 130 and the number of first semiconductor chips included in the first chip stack 110 are the same as each other, it is to be noted that these numbers may be different from each other. However, the thickness of the third chip stack 130 may be substantially the same as the thickness H1 of the first chip stack 110. Hereinafter, for the sake of convenience in explanation, the third semiconductor chips 130-1 to 130-4 are sequentially denoted by the reference numerals 130-1 to 130-4, respectively, from closest one to farthest one with respect to the base substrate 100.

The third semiconductor chips 130-1 to 130-4 may be the same chips, in particular, the same memory chips. Furthermore, the third semiconductor chips 130-1 to 130-4 may be the same chips as the first semiconductor chips 110-1 to 110-4 and/or the second semiconductor chips 120-1 to 120-4.

Each of the third semiconductor chips 130-1 to 130-4 may include an active surface 131 on which third chip pads 134 are disposed, an inactive surface 132 which faces away the active surface 131, and a side surface which connects the active surface 131 and the inactive surface 132 with each other. As opposed to the position of the first chip pads 114, the third chip pads 134 may be disposed in the other edge region, for example, a right edge region, of both edge regions of the active surface 131 in the first direction. In the case where the third semiconductor chips 130-1 to 130-4 are the same chips as the first semiconductor chips 110-1 to 110-4, the third semiconductor chips 130-1 to 130-4 may be in the same state as a state in which the first semiconductor chips 110-1 to 110-4 are rotated by 180 degrees about one axis parallel to the vertical direction.

The third semiconductor chips 130-1 to 130-4 may be stacked on the base substrate 100 in a form in which the inactive surface 132 faces the base substrate 100 and the active surface 131 faces away from the inactive surface 132, that is, in a face-up form. An adhesive layer 137 may be formed on the inactive surface 132 of each of the third semiconductor chips 130-1 to 130-4.

The plurality of third semiconductor chips 130-1 to 130-4 may be stacked in a form in which all of the third chip pads 134 are exposed. For example, the plurality of third semiconductor chips 130-1 to 130-4 may be stacked with a predetermined offset from the other side where the third chip pads 134 are disposed, for example, a right side, toward one side which faces away from the other side, for example, a left side, in the first direction. Namely, the plurality of third semiconductor chips 130-1 to 130-4 may be stacked in the second offset direction.

According to such offset stacking, one of the third semiconductor chips 130-1 to 130-4 may be in a state in which the other end, for example, a right end, positioned opposite to the second offset direction projects out from under another one of the third semiconductor chips 130-1 to 130-4 lying immediately thereon. Because the third chip pads 134 are disposed and exposed on the projecting end, third interconnectors 135 to be connected with the third chip pads 134 may be formed.

The third interconnectors 135 may be formed at the other side, for example, a right side, of the third chip stack 130. The third interconnectors 135 may electrically connect the third semiconductor chips 130-1 to 130-4 with one another and electrically connect the third chip stack 130 with the base substrate 100. In the present embodiment, the third interconnectors 135 may be bonding wires which connect the third chip pads 134 adjacent in the vertical direction with one another and connect the third chip pads 134 of the lowermost third semiconductor chip 130-1 to the third conductive pads 103-3. In other words, the third chip stack 130 may be electrically connected to the base substrate 100 by wire bonding. However, it is to be noted that the present embodiment is not limited thereto, and various types of electrical interconnectors such as leads, conductive tapes, conductive spacers and through electrodes may be used as the third interconnectors 135.

The fourth chip stack 140 may be disposed on the third chip stack 130. The present embodiment illustrates a case where the fourth chip stack 140 includes four fourth semiconductor chips 140-1 to 140-4. However, it is to be noted that the disclosure is not limited thereto, and the number of semiconductor chips included in the fourth chip stack 140 may be variously changed. Also, while, in the present embodiment, the number of fourth semiconductor chips included in the fourth chip stack 140 and the number of first semiconductor chips included in the first chip stack 110 are the same as each other, it is to be noted that these numbers may be different from each other. In addition, while it is illustrated that the thickness of the fourth chip stack 140 is the same as the thickness of the first and second chip stacks 110 and 120, it is to be noted that the thickness of the fourth chip stack 140 may be different from the thickness of the first and second chip stacks 110 and 120. Hereinafter, for the sake of convenience in explanation, the fourth semiconductor chips 140-1 to 140-4 are sequentially denoted by the reference numerals 140-1 to 140-4, respectively, from closest one to farthest one with respect to the base substrate 100.

The fourth semiconductor chips 140-1 to 140-4 may be the same chips, in particular, the same memory chips. Further, the fourth semiconductor chips 140-1 to 140-4 may be the same chips as the first semiconductor chips 110-1 to 110-4.

Each of the fourth semiconductor chips 140-1 to 140-4 may include an active surface 141 on which fourth chip pads 144 are disposed, an inactive surface 142 which faces away from the active surface 141, and a side surface which connects the active surface 141 and the inactive surface 142 with each other. Similar to the position of the first chip pads 114, the fourth chip pads 144 may be disposed in one edge region, for example, a left edge region, of both edge regions of the active surface 141 in the first direction. In the case where the fourth semiconductor chips 140-1 to 140-4 are the same chips as the first semiconductor chips 110-1 to 110-4, the fourth semiconductor chips 140-1 to 140-4 may be stacked to the same state as the first semiconductor chips 110-1 to 110-4 of the first chip stack 110.

The fourth semiconductor chips 140-1 to 140-4 may be stacked on the third chip stack 130 in a form in which the inactive surface 142 faces the base substrate 100 and the active surface 141 faces away from the inactive surface 142, that is, in a face-up form. An adhesive layer 147 may be formed on the inactive surface 142 of each of the fourth semiconductor chips 140-1 to 140-4. By the adhesive layer 147, each of the fourth semiconductor chips 140-1 to 140-4 may be attached to each of the fourth semiconductor chips 140-1 to 140-3 and the active surface 131 of the third semiconductor chip 130-4 positioned uppermost in the third chip stack 130 and/or the top surface of the printed circuit board 150 lying thereunder.

The fourth semiconductor chips 140-1 to 140-4 may be stacked in a form in which all of the fourth chip pads 144 are exposed. For example, the fourth semiconductor chips 140-1 to 140-4 may be stacked with a predetermined offset from one side where the fourth chip pads 144 are disposed, for example, a left side, toward the other side which faces away from the one side, for example, a right side, in the first direction. Namely, the fourth semiconductor chips 140-1 to 140-4 may be stacked in the first offset direction.

According to such offset stacking, one of the fourth semiconductor chips 140-1 to 140-4 may be in a state in which one end, for example, a left end, positioned opposite to the first offset direction projects out from under another one of the fourth semiconductor chips 140-1 to 140-4 lying immediately thereon. Because the fourth chip pads 144 are disposed and exposed on the projecting end, fourth interconnectors 145 to be connected with the fourth chip pads 144 may be formed. Moreover, the fourth semiconductor chip 140-1 positioned lowermost in the fourth chip stack 140 may have an end which projects leftward out from over the third semiconductor chip 130-4 positioned uppermost in the third chip stack 130 such that the third chip pads 134 of the third semiconductor chip 130-4 positioned uppermost in the third chip stack 130 are exposed. A portion of the left end of the fourth semiconductor chip 140-1 which projects, as described above, out from over the third semiconductor chip 130-4 positioned uppermost in the third chip stack 130 may overlap with the printed circuit board 150.

The fourth interconnectors 145 may be formed at one side, for example, a left side, of the fourth chip stack 140. The fourth interconnectors 145 may electrically connect the fourth semiconductor chips 140-1 to 140-4 with one another and electrically connect the fourth chip stack 140 with the printed circuit board 150. In the present embodiment, the fourth interconnectors 145 may be bonding wires which connect the fourth chip pads 144 adjacent in the vertical direction with one another and connect the fourth chip pads 144 of the lowermost fourth semiconductor chip 140-1 to second bond fingers 152-2 of the printed circuit board 150. In other words, the fourth chip stack 140 may be electrically connected to the printed circuit board 150 by wire bonding. The fourth chip stack 140 may be electrically connected to the base substrate 100, in particular, the fourth conductive pads 103-4, through the printed circuit board 150. The printed circuit board 150 and the connection of the fourth chip stack 140 and the base substrate 100 therethrough will be described later.

As a consequence, the stack structure of the third chip stack 130 and the fourth chip stack 140 may have an arrow shape which directs in the second offset direction or directs toward the printed circuit board 150 in the first direction.

As a result, the first to fourth chip stacks 110, 120, 130 and 140 which have an X shape or a shape similar thereto may be formed on the base substrate 100. The printed circuit board 150 may be positioned in a center bottom region that is defined by the X shape. As long as each of the first and third chip stacks 110 and 130 which are positioned on both sides of the printed circuit board 150 is offset-stacked in a direction facing the printed circuit board 150 in the first direction and has substantially the same thickness as the printed circuit board 150, the number, type and so forth of chips included in each of the first and third chip stacks 110 and 130 may be variously changed. In the case where the first chip stack 110, the printed circuit board 150 and the third chip stack 130 have the same thickness, the second chip stack 120 and the fourth chip stack 140 may be positioned on a plane including the top surface of the first chip stack 110, the top surface of the printed circuit board 150 and the top surface of the third chip stack 130. As long as each of the second and fourth chip stacks 120 and 140 has a portion which projects out from over the each of the first and third chip stacks 110 and 130 and thereby is offset-stacked in a direction facing away from the printed circuit board 150 while partially overlapping with the printed circuit board 150, the thickness of each of the second and fourth chip stacks 120 and 140 and the number, type and so forth of chips included in each of the second and fourth chip stacks 120 and 140 may be variously changed. The first to fourth chip stacks 110, 120, 130 and 140 may have a symmetrical structure with respect to the printed circuit board 150, but may have an asymmetrical structure in the case where the thicknesses of the second chip stack 120 and the fourth chip stack 140 are different from each other.

As described above, the printed circuit board 150 may perform the function of electrically connecting the second chip stack 120 and the fourth chip stack 140 to the base substrate 100. To this end, the printed circuit board 150 may include a first conductive structure 154-1 which extend from the first bond finger 152-1, connected with the second interconnectors 125, through the printed circuit board 150 to the first connection terminals 156-1 of the printed circuit board 150, and a second conductive structure 154-2 which extend from the second bond finger 152-2, connected with the fourth interconnectors 145, through the printed circuit board 150 to the second connection terminals 156-2 of the printed circuit board 150. The first and second connection terminals 156-1 and 156-2 may be connected to the second and fourth conductive pads 103-2 and 103-4, respectively. By this fact, the second chip stack 120 may be electrically connected to the base substrate 100 through the first conductive structure 154-1 and the first connection terminals 156-1, and the fourth chip stack 140 may be electrically connected to the base substrate 100 through the second conductive structure 154-2 and the second connection terminals 156-2.

The first bond fingers 152-1 may be disposed closer to the second chip stack 120 than the second bond fingers 152-2 while being spaced apart from the second chip stack 120 by a predetermined distance in the first direction, and may be arranged in a line in the second direction. The second bond fingers 152-2 may be disposed closer to the fourth chip stack 140 than the first bond fingers 152-1 while being spaced apart from the fourth chip stack 140 by a predetermined distance in the first direction, and may be arranged in a line in the second direction. Accordingly, the first and second bond fingers 152-1 and 152-2 which are disposed in two lines in the second direction between the second chip stack 120 and the fourth chip stack 140 may be formed on the top surface of the printed circuit board 150.

The printed circuit board 150 may overlap with a portion of the bottom surface of the second chip stack 120 which partially projects toward the other side, for example, the right side, from the first chip stack 110, and may overlap with a portion of the bottom surface of the fourth chip stack 140 which partially projects toward the one side, for example, the left side, from the third chip stack 130. By this fact, the printed circuit board 150 may serve to support the second chip stack 120 and the fourth chip stack 140. As the overlapping areas between the printed circuit board 150 and the second and fourth chip stacks 120 and 140 increase, the supporting role may be strengthened, thereby ensuring structural stability. In particular, if regions where the second and fourth chip pads 124 and 144 of the second and fourth chip stacks 120 and 140 are disposed overlap with the printed circuit board 150, it is possible to secure the stability of work during wire bonding.

In the present embodiment, the reason why such a printed circuit board 150 is used as an element for connecting the second chip stack 120 and the fourth chip stack 140 to the base substrate 100 is as follows. If the second chip stack 120 and the fourth chip stack 140 are connected to the base substrate 100 by bonding wires, because the length of the bonding wires becomes too long, a process failure such as wire sweeping may occur, and the electrical characteristics of the semiconductor package may be degraded by an increase in resistance due to the length of the bonding wires. Alternatively, if the second chip stack 120 and the fourth chip stack 140 are connected to the base substrate 100 by using an interposer structure which includes conductive vias, for example, through-silicon vias (TSV), in the case where the distance between the second chip stack 120 and the fourth chip stack 140 and the base substrate 100 increases, the height of the vias should also be increased together, whereas, because the diameter of the vias is restricted by the pitch of the second and fourth chip pads 124 and 144 of the second and fourth chip stacks 120 and 140, increasing the diameter of the vias to a predetermined size or larger may be limited. Because there is a restriction in terms of aspect ratio in an etching process and a plating process for forming the vias, it is actually difficult to form the vias having a predetermined height or higher. Therefore, in the present embodiment, the printed circuit board 150 may be used to solve the above problems.

Meanwhile, in the printed circuit board 150 according to the present embodiment, the pitch of the first and second bond fingers 152-1 and 152-2 may be determined in consideration of the pitch of the second and fourth chip pads 124 and 144. On the other hand, because, for example, solder balls as the connection terminals 156-1 and 156-2 for connecting the printed circuit board 150 to the base substrate 100 have a limitation in size reduction, the pitch of ball lands (not illustrated) of the printed circuit board 150 to which the solder balls are connected may be several times larger than the pitch of the first and second bond fingers 152-1 and 152-2. Specifically, connection terminals such as solder balls are required to have at least a predetermined size in order to prevent the non-contact of the connection terminals due to distortion or warpage of a printed circuit board during a reflow process. On the other hand, because bonding wires are not bonded through a reflow process, such a limitation does not exist. Therefore, bond fingers may be formed to have a fine pitch relative to ball lands. Because of such a difference in pitch, as illustrated in FIG. 1, each of the first and second conductive structures 154-1 and 154-2 cannot have a straight vertical path from the top surface to the bottom surface of the printed circuit board 150, and may have a bent shape which has a first vertical path extending vertically downward from each of the first and second bond fingers 152-1 and 152-2, a second vertical path extending vertically upward from each of the ball lands and a horizontal path connecting the first vertical path and the second vertical path. In an embodiment, the first vertical path extending vertically downward from the first bond finger 152-1 and the second vertical path extending vertically upward from the ball land may be referred to as a vertical pattern. In an embodiment, the first vertical path extending vertically downward from the second bond finger 152-2 and the second vertical path extending vertically upward from the ball land may be referred to as a vertical pattern. In an embodiment, the horizontal path connecting the first vertical path and the second vertical path may be referred to as a horizontal pattern. Hereinafter, an example of the printed circuit board 150 according to the present embodiment will be described with reference to FIGS. 3 to 5.

Figure 3:
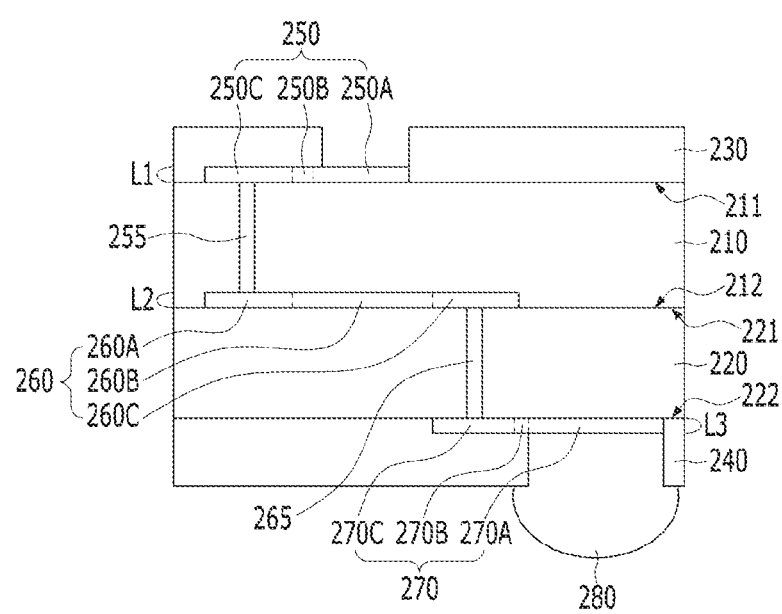
FIG. 3 is a cross-sectional view illustrating a printed circuit board in accordance with an embodiment of the present disclosure.
Figure 4A:
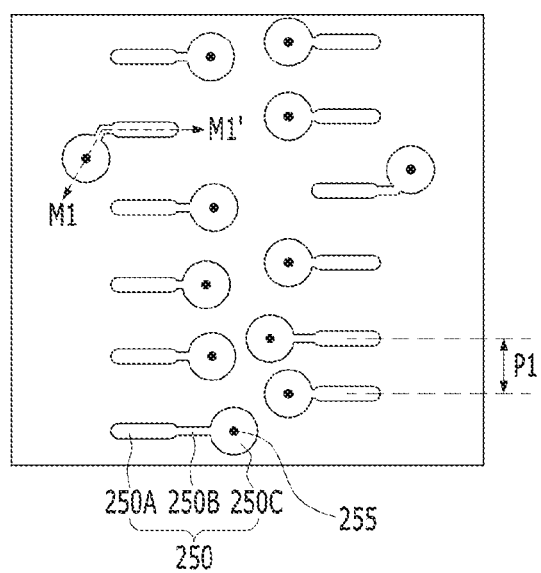
Figure 4B:
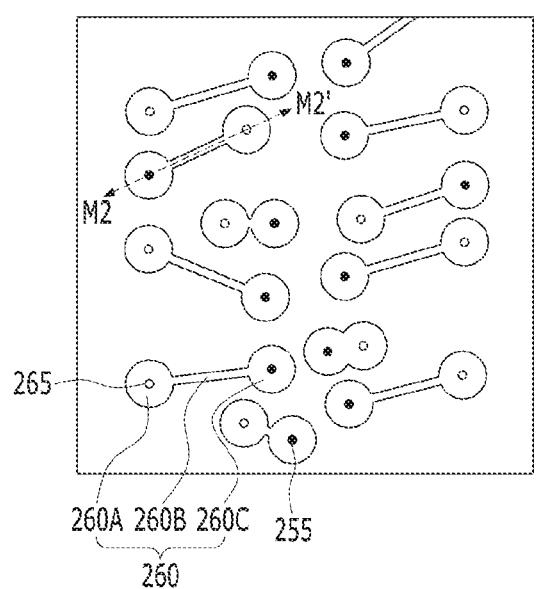
Figure 5:
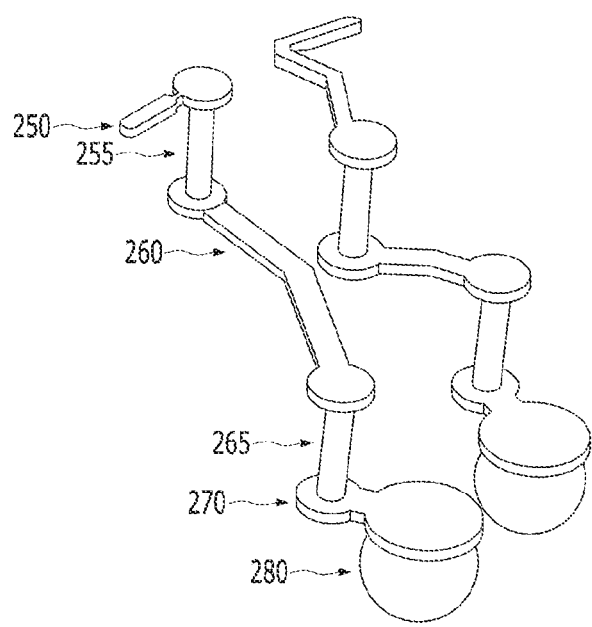
FIG. 5 is a perspective view illustrating an example of shapes of conductive structures illustrated in FIG. 3.

FIG. 3 is a cross-sectional view illustrating a printed circuit board in accordance with an embodiment of the present disclosure, FIGS. 4A, 4B and 4C are planar views of first to third wiring layers, respectively, illustrated in FIG. 3, and FIG. 5 is a perspective view illustrating an example of shapes of conductive structures illustrated in FIG. 3. The first wiring layer of FIG. 3 illustrates the cross-section taken along the line M1-M1' of FIG. 4A, the second wiring layer of FIG. 3 illustrates the cross-section taken along the line M2-M2' of FIG. 4B, and the third wiring layer of FIG. 3 illustrates the cross-section taken along the line M3-M3' of FIG. 4C.

Referring to FIGS. 3 to 5, the printed circuit board in accordance with the present embodiment may include a first base layer 210, a second base layer 220, a first insulation layer 230, a second insulation layer 240, and first to third conductive layers L1, L2 and L3.

The first base layer 210 may include a first surface 211 on which the first conductive layer L1 and the first insulation layer 230 are formed, and a second surface 212 which faces away from the first surface 211 and faces a first surface 221 of the second base layer 220. The second base layer 220 may include the first surface 221 and a second surface 222 which faces away from the first surface 221 and on which the third conductive layer L3 and the second insulation layer 240 are formed. The first and second base layers 210 and 220 may form the body or core of the printed circuit board, and may include a material such as epoxy resin or polyimide.

The first insulation layer 230 may have openings which are formed on the first surface 211 of the first base layer 210 and expose portions of the first conductive layer L1, in particular, bond fingers 250A. The second insulation layer 240 may have openings which are formed on the second surface 222 of the second base layer 220 and expose portions of the third conductive layer L3, in particular, ball lands 270A. The first and second insulation layers 230 and 240 may include various insulation materials such as solder resist.

The first conductive layer L1 may include a plurality of first conductive patterns 250 which are formed on the first surface 211 of the first base layer 210 and are spaced apart from one another. Each of the first conductive patterns 250 may include a portion to which a bonding wire or the like may be connected, that is, the bond finger 250A, a first line portion 250B which extends from the bond finger 250A and has a relatively narrow width, and a first end 250C which is positioned at the end of the first line portion 250B and has a larger width than the first line portion 250B. The first end 250C may overlap with a first conductive via 255 and be connected with one end, for example, a top end, of the first conductive via 255.

The second conductive layer L2 may include a plurality of second conductive patterns 260 which are formed on the first surface 221 of the second base layer 220 to have surfaces exposed on the second surface 212 of the first base layer 210 in the first base layer 210 and are spaced apart from one another. However, it is to be noted that the disclosure is not limited thereto, and in another embodiment, the second conductive layer L2 may include a plurality of second conductive patterns which are formed on the second surface 212 of the first base layer 210 to have surfaces exposed on the first surface 221 of the second base layer 220 in the second base layer 220. Each of the second conductive patterns 260 may include a second line portion 260B which has a relatively narrow width, and one second end 260A and the other second end 260C which are positioned at both ends, respectively, of the second line portion 260B and have a width larger than the second line portion 260B. The one second end 260A may overlap with the first conductive via 255 and be connected with the other end, for example, a bottom end, of the first conductive via 255. The other second end 260C may overlap with a second conductive via 265 and be connected with one end, for example, a top end, of the second conductive via 265.

The third conductive layer L3 may include a plurality of third conductive patterns 270 which are formed on the second surface 222 of the second base layer 220 and are spaced apart from one another. Each of the third conductive patterns 270 may include a portion which may be connected with a connection terminal 280 such as a solder ball, for example, a ball land 270A, a third line portion 270B which extends from the ball land 270A and has a relatively narrow width, and a third end 270C which is positioned at the end of the third line portion 270B and has a width larger than the third line portion 270B. The third end 270C may overlap with the second conductive via 265 and be connected with the other end, for example, a bottom end, of the second conductive via 265.

The first conductive via 255 may extend in the vertical direction through the first base layer 210, and may connect the first end 250C of the first conductive pattern 250 and the one second end 260A of the second conductive pattern 260 which overlap with each other, thereby electrically connecting the first conductive pattern 250 and the second conductive pattern 260 corresponding thereto. That is to say, the first conductive via 255 may provide an electrical connection between the first conductive layer L1 and the second conductive layer L2. The second conductive via 265 may extend in the vertical direction through the second base layer 220, and may connect the other second end 260C of the second conductive pattern 260 and the third end 270C of the third conductive pattern 270 which overlap with each other, thereby, electrically connecting the second conductive pattern 260 and the third conductive pattern 270 corresponding thereto. That is to say, the second conductive via 265 may provide an electrical connection between the second conductive layer L2 and the third conductive layer L3.

By this fact, a conductive structure which provides an electrical connection from the bond finger 250A to the ball land 270A and includes the first conductive pattern 250, the first conductive via 255, the second conductive pattern 260, the second conductive via 265 and the third conductive pattern 270 may be formed in the printed circuit board. The first conductive via 255 may provide a vertical path which extends vertically downward from the first conductive pattern 250 including the bond finger 250A, the second conductive via 265 may provide a vertical path which extends vertically upward from the third conductive pattern 270 including the ball land 270A, and the second conductive pattern 260 therebetween may provide a horizontal path which connects the first conductive via 255 and the second conductive via 265.

By the printed circuit board described above, even though a pitch P1 of the bond fingers 250A of the first conductive layer L1 is smaller than a pitch P2 of the ball lands 270A of the third conductive layer L3 and thus it is difficult to directly connect the bond fingers 250A and the ball lands 270A, the difference in pitch may be compensated for by providing the second conductive layer L2 between the first conductive layer L1 and the third conductive layer L3.

The bond fingers 250A according to the present embodiment may be substantially the same as the first and second bond fingers 152-1 and 152-2 described above with reference to FIG. 2. Further, the conductive structure including the first conductive pattern 250, the first conductive via 255, the second conductive pattern 260, the second conductive via 265 and the third conductive pattern 270 may correspond to each of the first and second conductive structures 154-1 and 154-2 described above with reference to FIG. 1. In addition, the connection terminals 280 may correspond to the first and second connection terminals 156-1 and 156-2 described above with reference to FIG. 1.

According to the semiconductor package described above, the following effects may be achieved.

By stacking semiconductor chips in an X shape or a shape similar thereto, a large number of semiconductor chips may be stacked, and thus, a high capacity/high performance semiconductor package may be realized. In particular, by stacking semiconductor chips in a predetermined offset direction to a predetermined height and stacking semiconductor chips in an opposite offset direction from a height higher than the predetermined height, the planar area of the semiconductor package may be reduced.

In addition, by directly connecting a bottom chip stack to a base substrate by wire bonding or the like and connecting a top chip stack to the base substrate through a printed circuit board, it is possible to overcome limitations that are caused by a process failure or a degradation in electrical characteristics due to the long formation of wires.

Moreover, by providing a printed circuit board including an intermediate layer which compensates for the difference in pitch between bond fingers and ball lands, the connection between the top chip stack and a base substrate through the printed circuit board may be easily implemented.

Furthermore, as the printed circuit board supports the top chip stack, in particular, a bottom portion of a region where chip pads are disposed, workability in a process such as wire bonding may be improved, and structural stability may be secured.

Figure 6:
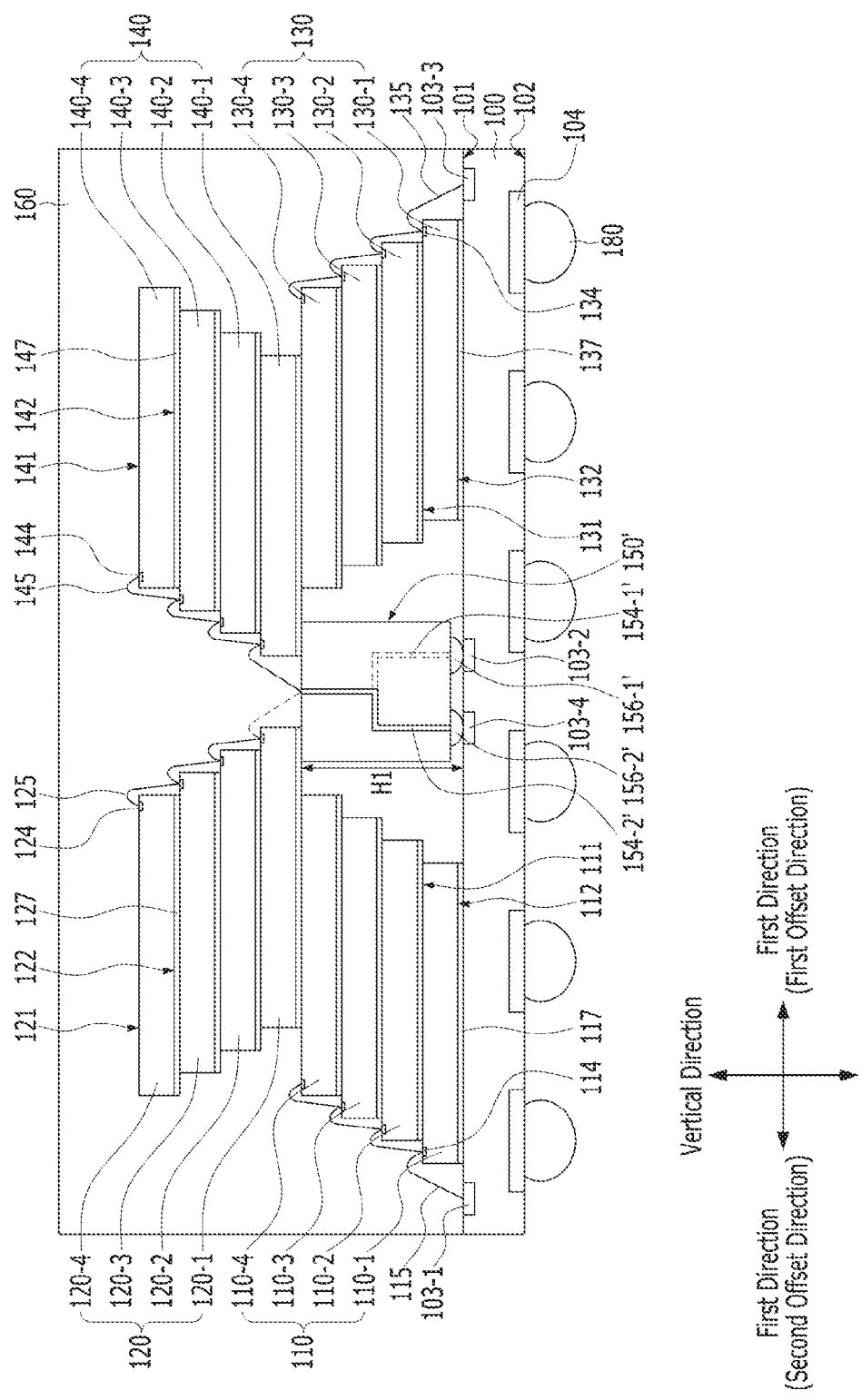
FIG. 6 is a cross-sectional view illustrating a semiconductor package in accordance with another embodiment of the present disclosure.
Figure 7:
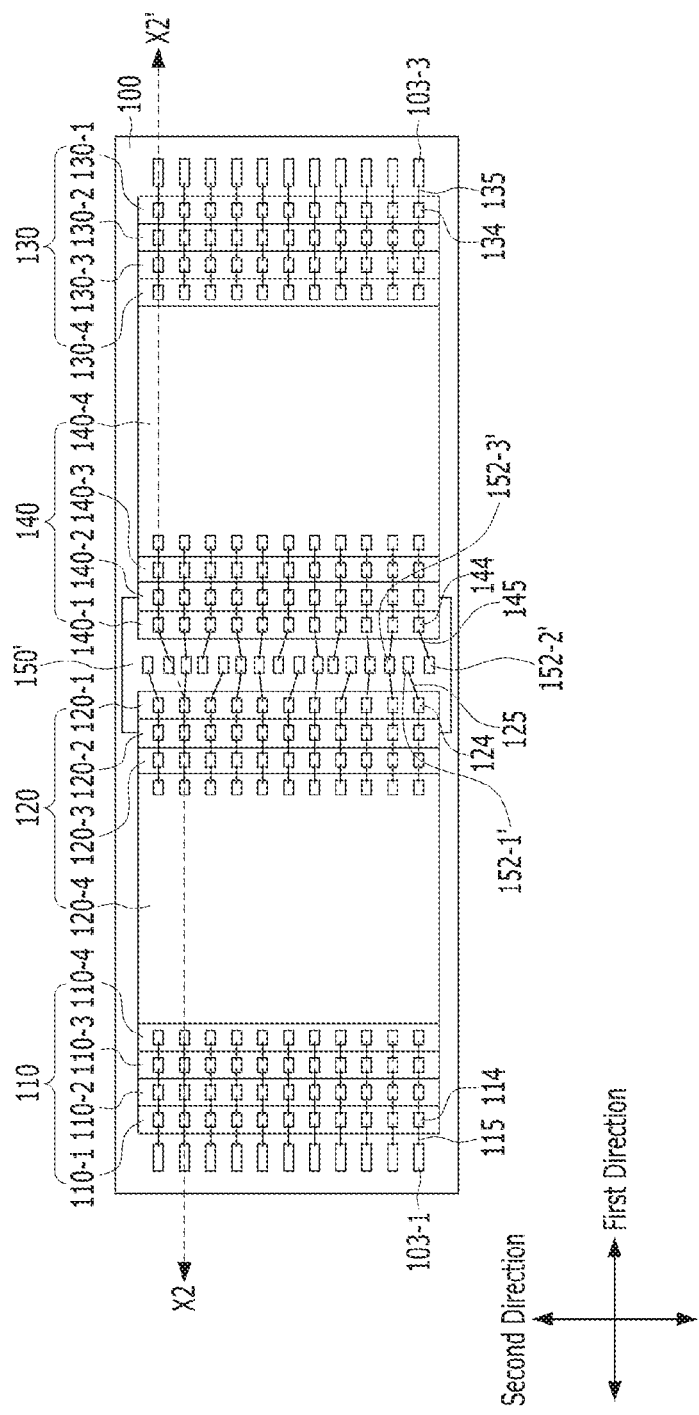
FIG. 7 is a planar view, seen from the top, of the semiconductor package illustrated in FIG. 6.

FIG. 6 is a cross-sectional view illustrating a semiconductor package in accordance with another embodiment of the present disclosure, and FIG. 7 is a planar view, seen from the top, of the semiconductor package illustrated in FIG. 6. FIG. 6 illustrates the cross-section taken along the line X2-X2' of FIG. 7. In the following description of the present embodiment, detailed descriptions for substantially the same components as those of the embodiment described above with reference to FIGS. 1 and 2 will be omitted.

Referring to FIGS. 6 and 7, the semiconductor package in accordance with the present embodiment may include a base substrate 100, first to fourth chip stacks 110, 120, 130 and 140 and a printed circuit board 150' which are disposed on the base substrate 100, and a molding layer 160 which covers the first to fourth chip stacks 110, 120, 130 and 140 and the printed circuit board 150' on the base substrate 100.

Bond fingers 152-1', 152-2' and 152-3' on the top surface of the printed circuit board 150' may be arranged in a line in the second direction, unlike the above-described embodiment. The bond finger 152-1' which are electrically connected with the second chip stack 120 will be hereinafter referred to as first bond fingers 152-1', the bond fingers 152-2' which are electrically connected with the fourth chip stack 140 will be hereinafter referred to as second bond finger 152-2', and the bond fingers 152-3' which are connected in common with the second and fourth chip stacks 120 and 140 will be hereinafter referred to as third bond fingers 152-3'.

Such first to third bond fingers 152-1', 152-2' and 152-3' may be arranged in a region which does not overlap with the second chip stack 120 and the fourth chip stack 140. The first bond fingers 152-1' may be portions to which input/output signals with respect to the second chip stack 120 are applied, and the second bond finger 152-2' may be portions to which input/output signals with respect to the fourth chip stack 140 are applied. The third bond fingers 152-3' may be portions to which a power supply voltage or a ground voltage is applied.

Because the number of the first to third bond fingers 152-1', 152-2' and 152-3' is larger than the number of second chip pads 124 arranged in the second direction and/or the number of fourth chip pads 144 arranged in the second direction, the second chip pads 124 and the fourth chip pads 144 and at least some of the first to third bond fingers 152-1', 152-2' and 152-3' cannot be disposed in straight lines extending in the first direction. In other words, the positions of the second chip pads 124 and the fourth chip pads 144 in the second direction and the positions of at least some of the first to third bond fingers 152-1', 152-2' and 152-3' connected thereto in the second direction may be different from each other.

The printed circuit board 150' may include a first conductive structure 154-1' which extend from the first bond fingers 152-1' through the printed circuit board 150' to first connection terminals 156-1' of the printed circuit board 150', a second conductive structure 154-2' which extend from the second bond finger 152-2' through the printed circuit board 150' to second connection terminals 156-2' of the printed circuit board 150', and third conductive structures which extend from the third bond finger 152-3' through the printed circuit board 150' to the other connection terminals (not illustrated) of the printed circuit board 150'.

In the case of the present embodiment, because the area occupied by the bond fingers 152-1', 152-2' and 152-3' is smaller than that in the above-described embodiment, the first and second chip stacks 110 and 120 may be moved further to the right. In other words, the overlapping area of the second chip stack 120 and the printed circuit board 150' may be increased. Similarly, the third and fourth chip stacks 130 and 140 may be moved further to the left to increase the overlapping area of the fourth chip stack 140 and the printed circuit board 150'.

In this case, because the supporting role of the printed circuit board 150' is strengthened, structural stability and process workability may be further improved. Besides, because the overlapping area of the second chip stack 120 and the printed circuit board 150' and the overlapping area of the fourth chip stack 140 and the printed circuit board 150' are increased, the planar area of the semiconductor package may be reduced.

Figure 8:
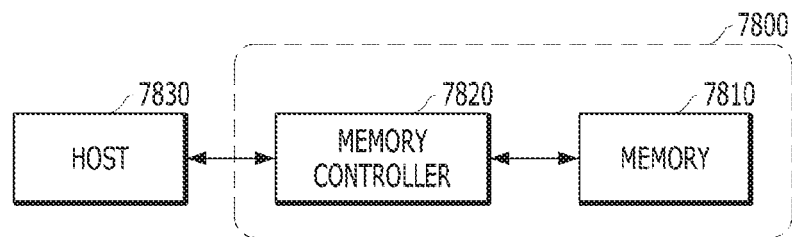
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
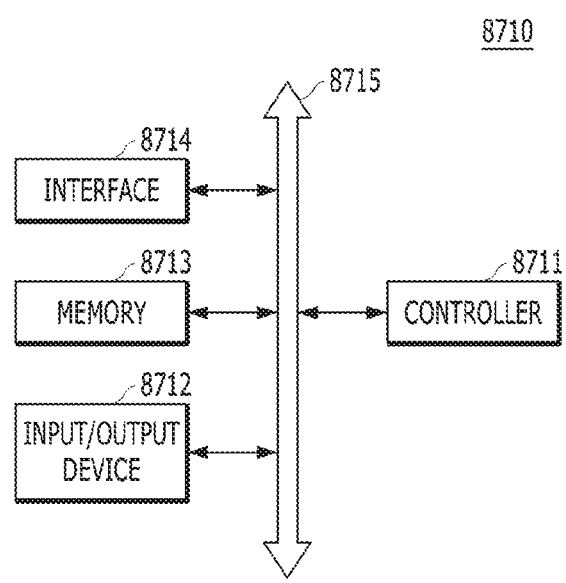
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the disclosure as defined in the following claims.

What is claimed is:

1. A semiconductor package comprising:
a base substrate;
a printed circuit board disposed on a first surface of the base substrate;
a first chip stack disposed on the first surface of the base substrate on one side of the printed circuit board, and including a plurality of first semiconductor chips which are offset-stacked in a first offset direction facing the printed circuit board;
a second chip stack disposed on the first chip stack, and including a plurality of second semiconductor chips which are offset-stacked in a second offset direction facing away from the printed circuit board;
a third chip stack disposed on the first surface of the base substrate on an other side of the printed circuit board, and including a plurality of third semiconductor chips which are offset-stacked in the second offset direction; and
a fourth chip stack disposed on the third chip stack, and including a plurality of fourth semiconductor chips which are offset-stacked in the first offset direction,
wherein the second and fourth chip stacks are electrically connected with the base substrate through the printed circuit board,
wherein the printed circuit board comprises:
a first conductive structure electrically connected with the second chip stack, and passing through the printed circuit board; and
a second conductive structure electrically connected with the fourth chip stack, and passing through the printed circuit board, and
wherein each of the first and second conductive structures includes a combination of a vertical pattern which is disposed in a vertical direction perpendicular to the first surface of the base substrate and a horizontal pattern which is disposed in a horizontal direction parallel to the first surface of the base substrate.

2. The semiconductor package according to claim 1,
wherein the printed circuit board includes first and second base layers which are stacked in the vertical direction, and
wherein each of the first and second conductive structures comprises:
a second conductive pattern disposed at an interface between the first base layer and the second base layer;
a first conductive pattern disposed on a first surface of the first base layer which faces away from the interface;
a third conductive pattern disposed on a second surface of the second base layer which faces away from the interface;
a first conductive via connecting a portion of the first conductive pattern and a portion of the second conductive pattern through the first base layer; and
a second conductive via connecting a portion of the second conductive pattern and a portion of the third conductive pattern through the second base layer.

3. The semiconductor package according to claim 2, wherein the first conductive via and the second conductive via are disposed at positions that do not overlap with each other.

4. The semiconductor package according to claim 2, wherein a pitch of the first conductive pattern and a pitch of the third conductive pattern are different from each other.

5. The semiconductor package according to claim 2,
wherein the printed circuit board further comprises:
a first insulation layer disposed on the first surface of the first base layer, and having an opening which exposes a portion of the first conductive pattern;
a second insulation layer disposed on the second surface of the second base layer, and having an opening which exposes a portion of the third conductive pattern; and
a connection terminal connected with the third conductive pattern through the opening of the second insulation layer, and
wherein the connection terminal is electrically connected with the base substrate.

6. The semiconductor package according to claim 5,
wherein each of the second and fourth chip stacks is connected to the first conductive pattern through the opening of the first insulation layer by wire bonding, and
wherein the connection terminal is a solder ball.

7. The semiconductor package according to claim 1,
wherein the second chip stack has a first end which projects out from over the first chip stack in the first offset direction,
wherein the fourth chip stack has a second end which projects out from over the third chip stack in the second offset direction, and
wherein a portion of the first end and a portion of the second end overlap with the printed circuit board.

8. The semiconductor package according to claim 7, wherein the printed circuit board supports the portion of the first end and the portion of the second end.

9. The semiconductor package according to claim 7,
wherein the second chip stack further includes second chip pads which are disposed on the portion of the first end and to which wires are bonded, and
wherein the fourth chip stack further includes fourth chip pads which are disposed on the portion of the second end and to which wires are bonded.

10. The semiconductor package according to claim 1,
wherein the printed circuit board comprises:
first bond fingers connected with the second chip stack through second interconnectors; and
second bond fingers connected with the fourth chip stack through fourth interconnectors,
wherein the first bond fingers are disposed in a region which is relatively closer to the second chip stack than the fourth chip stack, between the second chip stack and the fourth chip stack, and
wherein the second bond fingers are disposed in a region which is relatively closer to the fourth chip stack than the second chip stack, between the second chip stack and the fourth chip stack, to be spaced apart from the first bond fingers.

11. The semiconductor package according to claim 10, wherein the respective first and second bond fingers are arranged in a line.

12. The semiconductor package according to claim 1, wherein the printed circuit board comprises:
first bond fingers connected with the second chip stack through second interconnectors;

second bond fingers connected with the fourth chip stack through fourth interconnectors; and
third bond fingers connected with the second and fourth chip stacks through the second and fourth interconnectors.

13. The semiconductor package according to claim 12, wherein the first to third bond fingers are arranged in a line between the second chip stack and the fourth chip stack.

14. The semiconductor package according to claim 1, wherein the first chip stack, the third chip stack and the printed circuit board have substantially the same thickness.

15. The semiconductor package according to claim 14, wherein the second chip stack and the fourth chip stack are positioned on a plane which includes a top surface of the first chip stack, a top surface of the third chip stack and a top surface of the printed circuit board.

16. The semiconductor package according to claim 1, wherein the first and second chip stacks and the third and fourth chip stacks have substantially symmetrical structures with respect to the printed circuit board.

17. The semiconductor package according to claim 1, wherein at least two selected among the first to fourth semiconductor chips are the same memory chips.

18. The semiconductor package according to claim 1, wherein, in the case where the second or third semiconductor chips are the same chips as the first semiconductor chips, the second or third semiconductor chips are offset-stacked to correspond to a state in which the first semiconductor chips are rotated by 180 degrees about an axis perpendicular to the first surface of the base substrate.

19. The semiconductor package according to claim 1, wherein the first chip stack is directly connected with the base substrate through first interconnectors, and
wherein the third chip stack is directly connected with the base substrate through third interconnectors.

20. A semiconductor package comprising:
a base substrate;
a printed circuit board disposed on a first surface of the base substrate;
a first chip stack disposed on the first surface of the base substrate on one side of the printed circuit board, and including a plurality of first semiconductor chips which are offset-stacked in a first offset direction facing the printed circuit board;
a second chip stack disposed on the first chip stack, and including a plurality of second semiconductor chips which are offset-stacked in a second offset direction facing away from the printed circuit board;
a third chip stack disposed on the first surface of the base substrate on an other side of the printed circuit board, and including a plurality of third semiconductor chips which are offset-stacked in the second offset direction; and
a fourth chip stack disposed on the third chip stack, and including a plurality of fourth semiconductor chips which are offset-stacked in the first offset direction,
wherein the second and fourth chip stacks are electrically connected with the base substrate through the printed circuit board,
wherein the printed circuit board comprises:
first bond fingers connected with the second chip stack through second interconnectors; and
second bond fingers connected with the fourth chip stack through fourth interconnectors,
wherein the first bond fingers are disposed in a region which is relatively closer to the second chip stack than the fourth chip stack, between the second chip stack and the fourth chip stack, and
wherein the second bond fingers are disposed in a region which is relatively closer to the fourth chip stack than the second chip stack, between the second chip stack and the fourth chip stack, to be spaced apart from the first bond fingers.

21. The semiconductor package according to claim 20, wherein the respective first and second bond fingers are arranged in a line.

* * * * *